United States Patent [19]
Tsu et al.

[11] Patent Number: 5,635,741
[45] Date of Patent: *Jun. 3, 1997

[54] BARIUM STRONTIUM TITANATE (BST) THIN FILMS BY ERBIUM DONOR DOPING

[75] Inventors: Robert Tsu, Plano, Tex.; Bernard M. Kulwicki, North Attleboro, Mass.

[73] Assignee: Texas Instruments Incorporated, Dallas, Tex.

[*] Notice: The term of this patent shall not extend beyond the expiration date of Pat. No. 5,453,908.

[21] Appl. No.: 315,725

[22] Filed: Sep. 30, 1994

[51] Int. Cl.$^6$ ............................................. H01L 27/108
[52] U.S. Cl. ........................ 257/310; 257/532; 361/321.5
[58] Field of Search ................................ 257/310, 532; 361/321.5

[56] References Cited

U.S. PATENT DOCUMENTS

| | | | |
|---|---|---|---|
| 4,863,883 | 9/1989 | Menashi et al. | 501/138 |
| 5,314,651 | 5/1994 | Kulwicki | 264/65 |
| 5,453,908 | 9/1995 | Tsu et al. | 361/321.5 |

FOREIGN PATENT DOCUMENTS

| | | |
|---|---|---|
| 0476143A1 | 3/1992 | European Pat. Off. |
| 0571948A1 | 12/1993 | European Pat. Off. |

OTHER PUBLICATIONS

I. K. Yoo, S. B. Sesu, and J. Xing, *Mat. Res. Soc. Symp. Proc.* vol. 310 (1993).

L. A. Xue, Y. Chen, and R. J. Brook, *Materials Science and Engineeering*, B1, 193–201, (1988).

Rainer Waser, *J. A. Am. Ceram. Soc.* 74(8), 1934–40 (1991).

*Primary Examiner*—Mark V. Prenty
*Attorney, Agent, or Firm*—James E. Harris; Richard A. Stoltz; Richard L. Donaldson

[57] ABSTRACT

A semiconductor device and process for making the same are disclosed which incorporate a relatively large percentage of erbium dopant (1 to 5%) into a BST dielectric film 24 with small grain size (e.g. 10 nm to 50 nm). Dielectric film 24 is preferably disposed between electrodes 18 and 26 (which preferably have a Pt layer contacting the BST) to form a capacitive structure with a relatively high dielectric constant and relatively low leakage current. Apparently, properties of the thin film deposition and small grain size, including temperatures well below bulk BST sintering temperatures, allow the film to support markedly higher defect concentrations without erbium precipitation than are observed for bulk BST. For erbium doping levels generally between 1% and 3%, over an order of magnitude decrease in leakage current (compared to undoped BST) may be achieved for such films.

4 Claims, 1 Drawing Sheet

BARIUM STRONTIUM TITANATE (BST) THIN FILMS BY ERBIUM DONOR DOPING

CROSS-REFERENCE TO RELATED APPLICATIONS

The following related applications were filed concurrently with the instant application and are included herein by reference:

Ser. No. 08/315,454, filed Sep. 30, 1994, entitled "Improvement of Barium Strontium Titanate (BST) Thin Films Using Boron", pending; Ser. No. 08/315,648, filed Sep. 30, 1994, entitled "Barium Strontium Timate (BST) Thin Films by Holmium Donor Doping", now U.S. Pat. No. 5,453,908, Ser. No. 08/283,441, filed Aug. 1, 1994, entitled "A Conductive Amorphous Nitride Barrier Layer for High-Dielectric-Constant Material Electrodes", pending, is related to the instant application.

FIELD OF THE INVENTION

This invention relates to high dielectric constant thin films for microelectronic devices, and more particularly to improving dielectric properties of such films.

BACKGROUND OF THE INVENTION

Dynamic random-access memory (DRAM) integrated circuits, for example, are commonly used for storing data in a digital computer. Currently available DRAMs may coma over 16 million memory cells fabricated on a single crystal silicon chip, each memory cell generally comprising a single transistor connected to a miniature capacitor. In operation, each capacitor may be individually charged or discharged in order to "store" one bit on information. A DRAM is dynamic in the sense that charged memory cells must be refreshed, or recharged, periodically to maintain data integrity; otherwise, charged memory cells may quickly (generally in a fraction of a second) discharge through leakage to a point where they no longer appear to be set to the charged state.

To facilitate construction of 64 Mbit, 256 Mbit, 1 Gbit, and larger DRAMs with correspondingly smaller memory cells, capacitor structures and materials which can store the necessary charge in less chip space are needed; one of the most promising avenues of research is in the area of high dielectric constant materials (defined herein as having dielectric constants greater than 50). Lead zirconate titanate (PZT), barium titanate, strontium titanate, and barium strontium titanate are some common examples of such materials. It is desirable that such a material, if used for DRAMs and other microelectronics applications, be formable over an electrode and underlying structure (without significant harm to either), have low leakage current characteristics and long dielectric lifetime, and, for most applications, possess a high dielectric constant at frequencies of hundreds of MHz up to several GHz.

SUMMARY OF THE INVENTION

The present invention relates to a method of producing and a structure containing barium and/or strontium titanate dielectric films (hereafter referred to as BST) with improved properties. Although BST materials have been manufactured in bulk form previously, the properties of such materials are not yet well understood when formed as a thin film (generally less than 5 μm), i.e., on a semiconducting device. It is known that the dielectric constant of undoped bulk BST is maximized for median grain sizes roughly between 0.7 μm and 1.0 μm, and that for smaller grain sizes, dielectric constant falls off rapidly (thus BST with extremely small grains is usually undesirable). Unfortunately, BST applications in submicron microcircuits (e.g. DRAM capacitors) may place particular constraints on BST grain size. First, annealing temperature for BST thin films must generally be kept far below temperatures commonly used for sintering bulk BST ceramics (generally less than 700 C. vs typically greater than 1100 C. for bulk BST) to avoid damage to underlying device structure, thus limiting grain nucleation and growth kinetics. Second, desired film thickness may be much less than 5 μm (preferably between 0.05 μm and 0.1 μm), and it has been found that median grains sizes generally less than half the BST film thickness are required to control dielectric uniformity, e.g., across a large number of capacitors, and avoid shorted capacitors.

A BST grain in the 0.7 μm to 1.0 μm size range constitutes at least several billion unit cells connected in a perovskite crystal structure; a small BST grain of 0.01 μm size may only contain a few thousand. The larger grains typically have less than 0.5% of their unit cells lying on the outer shell of the grain, while the smaller grains may have 25% or more of their unit cells on the outer shell. It is believed that small grains consequently suffer from much larger lattice distortion and sensitivity to grain boundary composition. Additionally, the degree of polarization depends on BST grain sizes, crystallinity, and composition and the effects of adding BST dopants is difficult to predict for such grain sizes as it may not follow what is known for bulk ceramics.

It has now been found that erbium may be useful as a dopant for thin films comprised of small (10 nm to 50 nm median size) grains. We now believe that the solubility of erbium in thin films annealed at temperatures generally less than 700 C. may be much higher than for bulk ceramics. Several attributes of such films differ from ceramics: grain size is much smaller and grain surface area much larger; films form in a brief time, at low temperature, such that ionic diffusion is limited and thermal equilibrium may not be established; and high stresses occur due to mismatch with the substrate. Surprisingly, several percent erbium dopant has now been found to advantageously lower dielectric leakage for such a small-grained BST film. For example, erbium acetate may be added to a liquid precursor for metal-organic decomposition (MOD) to form a BST film. This technique appears readily adaptable to many forms of BST deposition such as: MOD using spin-on precursors, MOD using vapor phase transportation, MOD chemical vapor deposition, sol-gel, and sputtering.

Consequently, the present invention includes a novel method of forming a barium and/or strontium titanate dielectric film on a microelectronic device. In this method, a precursor is prepared by combining compounds of the elements erbium, titanium, and at least one of barium and/or strontium, preferably with the molar ratio of erbium to titanium in the precursor being between 0.01 and 0.05. One or more layers of such a precursor may be deposited and densified to form a precursor film on the device. The precursor film may subsequently be annealed at a temperature less than 700 C. (preferably less than 650 C., and more preferably, less than 600 C.) in an oxygen-containing atmosphere. This annealing forms a dielectric film comprising a plurality of erbium-doped barium and/or strontium titanate grains, preferably with a median grain size of between 10 nm and 50 nm.

The precursor may, for example, be prepared by combining barium acetate, strontium acetate, titanium ammonium lactate, and erbium nitrate and/or erbium acetate in a common aqueous solution. Other organic solvents may be added to the precursor to, for example, adjust the viscosity. The BST grains produced may be selected over a wide range of barium-strontium combinations (with between 40% and 70% of barium-strontium lattice sites in the grains occupied by barium being preferred). The dielectric film may be purposely constructed to be titanium rich; i.e., only 93% to 99.9% of the titanium in the precursor may be integrated into the BST grains; it is believed that the remainder may exist in the boundary regions as oxidized titanium. The precursor preparation may further comprise addition of a compound of the element manganese, such that the molar ratio of the manganese to the erbium in the precursor is between 0.1 and 1.0.

The present invention also comprises a method of forming a capacitive structure on a microelectronic device; such a capacitive structure generally having a dielectric laminate disposed between a first electrode and a second electrode. The method may comprise forming a first electrode on a substrate. The method further comprises depositing two or more films over the first electrode, with each film comprising titanium and at least one of barium and strontium. Additionally, at least one of the films further comprises erbium, preferably in a ratio to titanium of between 0.01 and 0.05. The method further comprises annealing the films at a temperature below 700 C. in an oxygen-containing atmosphere. This is believed to form a dielectric laminate comprising a plurality of grains with a perovskite crystal structure, each grain comprising titanium, oxygen, and at least one of barium and strontium; furthermore, these grains preferably have a grain size of between 10 nm and 50 nm. Erbium-doped grains are formed in at least a sublayer of the dielectric laminate during the annealling step. The method may further comprise forming a second electrode over the dielectric laminate.

In accordance with the present invention, a capacitive structure on a microelectronic device may be formed. In this structure, a dielectric laminate is generally dispersed between first and second electrodes having facing platinum surfaces. Generally, this dielectric laminate comprises two or more grains (and typically a large number of grains) having a perovskite crystal structure and a median grain size of between 10 nm and 50 nm, each grain comprising titanium, oxygen, and at least one of barium and strontium. Grains in at least a sublayer of the dielectric laminate are preferably erbium-doped. Preferably, such a sublayer has a ratio of erbium to titanium of between 0.01 and 0.05.

The doped grains may further comprise manganese in a molar ratio to erbium of between 0.1 and 1.0. Also, the structure may be made titanium-rich as previously detailed.

BRIEF DESCRIPTION OF THE DRAWINGS

This invention, including various features and advantages thereof, can be best understood by reference to the following drawings, wherein.

DETAILED DESCRIPTION OF THE PREFERRED EMBODIMENTS

High dielectric constant (HDC) materials have many microelectronic applications, such as DRAMs, static RAMs, and infrared detectors. Typically, these applications employ HDC materials in a capacitive structure, although the present invention may be used to make an HDC thin film with improved properties which is not part of a capacitor. For purposes of discussion, a capacitive structure containing an HDC thin film is shown in FIG. 1.

Figure 1A:
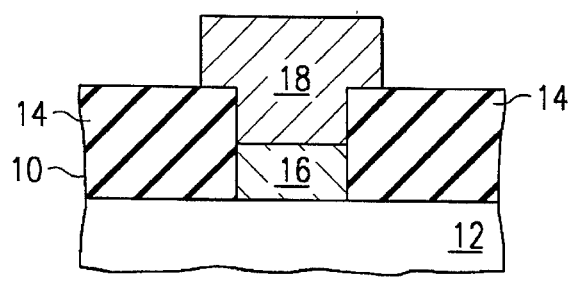
FIGS. 1A–1D show cross-sectioned elevations of one embodiment of a capacitive structure made according to a method of the invention.

A microelectronic device 10 is shown partially constructed in FIG. 1A. This device comprises a semiconductor substrate 12 (e.g. silicon), with an overlying insulation layer 14 (preferably of silicon dioxide). A first electrode 18 (preferably of platinum) is electrically connected to the substrate through a diffusion barrier 16 (e.g. of titanium nitride), this construction being used to prevent silicon in substrate 12 from diffusing through electrode 18 and forming silicon dioxide at the electrode-BST interface.

A BST precursor solution for thin films may be prepared as an aqueous solution of appropriate individual precursors, such as barium acetate, strontium acetate, and titanium ammonium lactate. Each individual precursor is preferably filtered (e.g. to a 0.2 μm level) to remove particulates which may impair the integrity of the films. The individual precursors are then blended and the stoichiometry (i.e. mole ratio) of the precursor solution is adjusted to that needed for a desired BST film, e.g. $(Ba_{0.67},Sr_{0.33})TiO_3$. At this point, the solution typically contain 10% to 15% oxide by weight.

Such a precursor solution may be modified to add erbium. For example, erbium acetate and/or erbium nitrate may be added to the solution such that the mole ratio of erbium to titanium in the solution is roughly 0.02. It is believed that if erbium is added to a stoichiometrically correct BST solution to reduce leakage, additional reduction in dielectric leakage for the final film may be gained by compensating for the erbium addition by: (1) adding additional titanium (e.g. titanium lactate) to the precursor solution; (2) adding an acceptor dopant, such as manganese (e.g. manganese acetate and/or manganese nitrate); or, (3) a combination of (1) and (2). Exact 1:1 compensation may not be necessary to gain a benefit. Such manganese and/or titanium addition may also offset a reduction in dielectric constant such as that observed in the uncompensated erbium-doped BST experiment (and such a combination may even improve the dielectric constant).

For application by a spin-on technique, the precursor solution may be evaporated down to remove most of the water. The residue may be mixed with further solvents (typically in a 1:1 to 1:2 ratio of residue to solvent), such as ethylene glycol monomethyl ether (EGME), isobutyl alcohol, or methoxymethanol to adjust viscosity and deposition thickness. The precursor solution may then be filtered through a 0.2 μm syringe and spin-coated (typically at 2000 to 3500 rpm, depending on desired film thickness) onto a wafer not containing, e.g., device 10.

Figure 1B:
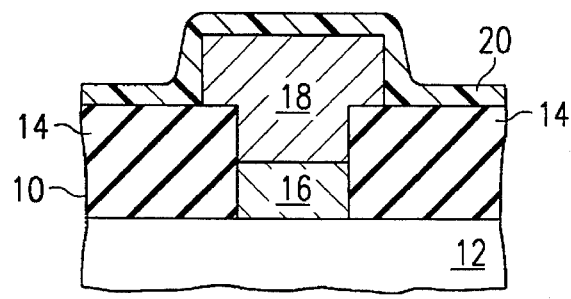

A first precursor film 20 is shown in FIG. 1B after spin-coating onto device 10. This film may, for example, be limited to 10–50 nm in thickness; at large thicknesses, the subsequent MOD reactions are difficult to complete. Typically, after spin-coating, a densification step (e.g. at 80 C. to 200 C. in a nitrogen ambient) is used to desorb solvents from and help prevent formation of voids in film 20. This may be followed by a firing (e.g. in an oxygen ambient such as $O_2$, $N_2O$, or $O_3$, at 400 C. to 500 C., preferably 450 C.) to decompose metal-organics and further densify film 20.

Figure 1C:
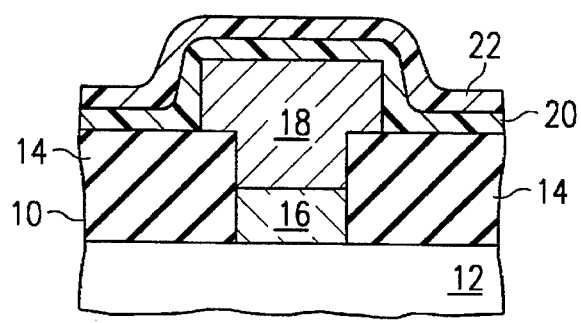

A second precursor film 22 (of the same precursor in this example) is shown in FIG. 1C after spin-coating and densification by the method described above. Several more precursor films may be added to obtain a desired thickness before final anneal. Final anneal temperatures generally range from 550 C. to 700 C. (less than 650 C. being preferable, less than 600 C. being more preferable if not limited by the nucleation temperature of the amorphous BST), and the anneal is carried out in an oxygen ambient such as $O_2$, $N_2O$, or $O_3$. During this anneal, perovskite phase BST crystals nucleate in the amorphous BST film and grow to a typical size of 10 nm to 50 nm. The specific distribution of erbium dopant within the BST film is not well understood at this point; it is believed that films formed at such temperatures and small grain sizes may support much higher defect concentrations than bulk BST without precipitation of erbium into a second phase.

Figure 1D:
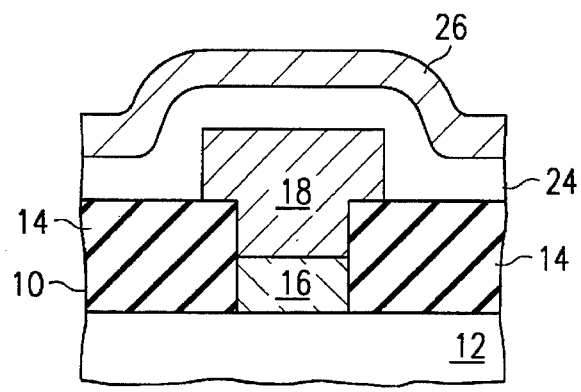

Dielectric film 24, shown in FIG. 1D, is a crystallized BST film with erbium dopant. This film is formed from precursor films 20 and 22, which are believed to join seamlessly (some BST crystals are formed which contain material from both films) during annealing. To complete a capacitor structure for device 10, a second (e.g. top) electrode 26 (preferably of platinum) may be deposited over dielectric film 24. It may be deskable to post-anneal device 10 after deposition of electrode 26 (e.g. at 550 C. in $O_2$ for 1 hour) to desorb any water which may have been absorbed into the BST-second electrode interface.

Experimental data is presented for capacitive measurements taken on structures similar in construction to those of FIG. 1. MOD BST dielectric films 24 of approximately 100 nm thickness and 20 nm grain size were deposited over an electrode 18 with a platinum top layer and a $ZrO_2$ barrier layer 16. The $ZrO_2$ barrier is non-conductive, and preferably would be replaced by a conductive barrier like TiN in, e.g., a DRAM application. A second platinum electrode 26 was deposited over film 24 to form a capacitor of roughly 10000 $\mu m^2$ area. This structure was repeated many times across a test wafer. A series of test wafers were prepared using stoichiometric BST precursor solution with erbium added in 1 mol % increments; measurements for several capacitive structures on each wafer were taken with a 1.6 V dc bias and a 100 kHz, 10 mV oscillator signal at a temperature of 25 C. These measurements were averaged for each wafer to obtain the data of Table 1.

These particular results show a decrease in dielectric constant over undoped BST for all levels of erbium doping. However, leakage current also decreases compared to undoped BST for up to three percent erbium doping (with more than an order of magnitude decrease for two percent erbium). Although not well understood, erbium concentrations added in a narrow range (e.g. 0.3 to 3 mol %) apparently reduce dielectric leakage for such a small-grained thin film. For larger erbium concentrations, dielectric leakage may actually increase.

TABLE 1

| Er to Ti Concentration (%) | Dielectric Constant | Leakage Current ($\times 10^{-6}$ A/cm$^2$) |
| --- | --- | --- |
| 0 | 190 | 0.8 |
| 1 | 170 | 0.3 |
| 2 | 150 | 0.06 |
| 3 | 150 | 0.2 |
| 4 | 150 | 2. |
| 5 | 130 | 4. |
| 6 | 140 | 3. |
| 7 | 150 | 5. |
| 8 | 140 | 5. |
| 9 | 140 | 6. |
| 10 | 140 | 0.6 |

Figure 2:
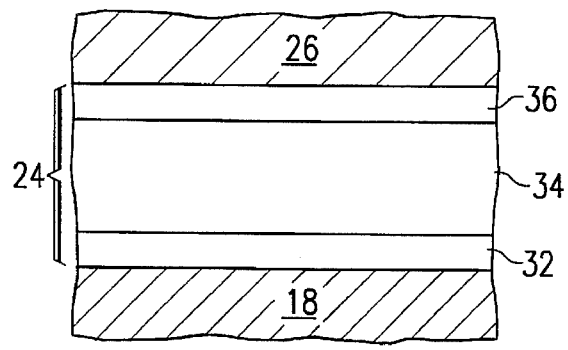
FIG. 2 shows a cross-sectioned segment of an embodiment wherein a dielectric laminate is constructed of 3 BST layers of varying composition.

An improved dielectric structure may be formed as shown in FIG. 2. This structure shows a dielectric film 24 comprising three separate (but not necessarily distinct) sublayers 32, 34, and 36. Using a layered MOD deposition technique such as described herein, such a structure may be formed using precursors with different constituent ratios. For example, sublayer 34 may be deposited with a stoichiometry which forms $(Ba_{0.67}Sr_{0.33})TiO_3$ grains when annealed, with little or no dopant material. Such a sublayer has a Curie point near room temperature, thus maximizing dielectric constant (but with a large dielectric leakage value). However, sublayers 32 and 36 may, for example, be deposited with a stoichiometry which forms BST (possibly having a different Ba-Sr ratio than layer 34) with 2% erbium dopant, which in these experiments gave a somewhat lower dielectric constant but markedly improved leakage characteristics.

Such a capacitive structure may, for example, use a relatively thick sublayer 34 if leakage is controllable using thin sublayers 32 and 36. During anneal, some cross-mixing of layers may occur, such that for the specific example, graded transition regions between adjacent sublayers 32, 34, and 36 may exist, with a similarly graded erbium concentration. The laminated structure may subsequently be treated as a single dielectric film with improved dielectric properties.

The invention is not to be construed as limited to the particular examples described herein, as these are to be regarded as illustrative, rather than restrictive. Although specific materials and processing techniques are described in the detailed description, many alternates exist. For example, electrodes may be constructed of Pt, Pd, Rh, Au, Ir, $RuO_2$, TaSiN, TiSiN, or alloys of these. Barrier layer 16 may alternately be constructed, e.g., of ZrN, HfN, TaSiN, or TiSiN. The shape of the capacitive structure discussed herein is meant to be illustrative, as the present invention may be applicable to a wide variety of HDC capacitor structures. The dielectric sublayers may be reversed such that an erbium-containing sublayer is sandwiched between two non-erbium-containing sublayers. Similarly, one sublayer of each type can be used, or more than three total sublayers can be used. Likewise, the ordering of electrode and dielectric formation may differ from that described (e.g. both electrodes may be formed after formation of a BST layer), in which case other electrode materials (e.g. low melting point) not mentioned above may be used. Titanium-rich precursors, which may also form oxidized titanium in boundary regions, are comprehended within the present invention. The BST with dopant film deposition method is not limited by MOD, while it includes CVD such as MOCVD, plasma enhanced CVD, and physical vapor deposition such as sputtering.

What is claimed is:

1. A capacitive structure on a microelectronic device, said capacitive structure comprising:

(a) first and second conductive electrodes, said electrodes having facing platinum surfaces;

(b) a dielectric laminate dispersed between said facing platinum surfaces, said dielectric laminate comprising two or more grains having a perovskite crystal structure, each grain comprising titanium, oxygen, and at least one of barium and strontium, said grains having a median size of between 10 nm and 50 nm; and (c) at least a sublayer of said dielectric laminate having said grains which are doped grains, said doped grains further comprising erbium and having a molar ratio of erbium to titanium of between 0.01 and 0.05, whereby erbium addition reduces leakage current through said dielectric laminate.

2. The structure of claim 1, wherein said doped grains further comprise manganese in a molar ratio to said erbium of between 0.1 and 1.0.

3. The structure of claim 1, further comprising oxidized titanium in said boundary regions between said grains in at least a portion of said dielectric laminate, said oxidized titanium comprising between 0.1% and 7% of the total amount of titanium contained in said dielectric laminate.

4. The structure of claim 1, wherein said grains are arranged roughly in two or more sublayers between said first and second electrodes, said sublayers which are adjacent having different relative concentrations of barium to strontium.

* * * * *